(12) United States Patent
Eban

(10) Patent No.: US 6,218,909 B1
(45) Date of Patent: *Apr. 17, 2001

(54) MULTIPLE FREQUENCY BAND VOLTAGE CONTROLLED OSCILLATOR

(75) Inventor: Alexander Eban, Barkan (IL)

(73) Assignee: Texas Insturments Israel Ltd., Kfar Saba (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,755

(22) Filed: Oct. 23, 1998

(51) Int. Cl.[7] ............................... H03B 5/08; H03B 5/18
(52) U.S. Cl. ........................ 331/117 R; 331/177 V; 331/36 C; 331/36 L; 331/179; 455/191.2
(58) Field of Search ................ 331/175 L, 177 V, 331/179, 36 C, 117 B; 455/191.2, 192.1

(56) References Cited

U.S. PATENT DOCUMENTS

| | | |
|---|---|---|
| 2,556,296 | 6/1951 | Rack . |
| 3,775,696 | 11/1973 | Garth .................................. 331/57 |
| 3,899,755 | 8/1975 | Uchida ............................ 331/36 C |
| 3,909,748 | 9/1975 | Yuan et al. ...................... 331/117 R |
| 4,010,428 | 3/1977 | Sunkler ........................... 331/117 R |
| 4,061,973 | 12/1977 | Reimers et al. ...................... 331/18 |
| 4,353,038 | 10/1982 | Rose et al. ..................... 331/36 C |
| 4,378,534 | 3/1983 | Goedken et al. ............... 331/177 V |
| 4,503,401 | 3/1985 | Kyriakos et al. . |
| 4,536,724 | 8/1985 | Hasegawa et al. ............. 331/177 V |
| 4,598,423 | * 7/1986 | Hettiger ........................ 331/179 X |
| 4,694,262 | * 9/1987 | Inoue et al. ......................... 331/96 |
| 4,779,063 | 10/1988 | Nagaoka ............................ 331/135 |
| 4,969,210 | 11/1990 | Hansen et al. ..................... 455/188 |
| 4,998,077 | 3/1991 | Nanni et al. ......................... 331/99 |
| 5,123,008 | 6/1992 | Beesley . |
| 5,327,106 | 7/1994 | Sanders ............................. 331/109 |
| 5,629,652 | 5/1997 | Weiss . |
| 5,689,819 | 11/1997 | Nishimura et al. . |
| 5,714,915 | 2/1998 | Brilka .......................... 331/117 R |

FOREIGN PATENT DOCUMENTS

2612017 * 9/1988 (FR) ................................. 331/181

OTHER PUBLICATIONS

"Sinewave Oscillators", H.L. Krauss, C.W. Bostian & F.H. Raab, Chapter 5, Solid State Radio Engineering, John Wiley, 1980.

* cited by examiner

*Primary Examiner*—Arnold Kinkead
(74) *Attorney, Agent, or Firm*—Howard Zaretsky

(57) ABSTRACT

A radio frequency oscillator containing a means of frequency band selection and a tuning mechanism permitting frequency variation within each of the bands. The oscillator typically consists of a transistor, a frequency determining circuit, one or more voltage controlled variable capacitance diodes for frequency tuning and frequency range switching means to step change the operating frequency. The frequency determining circuit can consist of a lumped inductor, a microstrip line or a combination of a microstrip line and a lumped inductor. The frequency determining circuit is typically connected to the base of the transistor. In a preferred embodiment the frequency range switching is accomplished using an RF switching diode, used to short out one or more portions of the tuned microstrip line in accordance with the required frequency step change. The circuit also incorporates additional circuitry to support frequency modulation.

33 Claims, 7 Drawing Sheets

MULTIPLE FREQUENCY BAND VOLTAGE CONTROLLED OSCILLATOR

FIELD OF THE INVENTION

The present invention relates generally to radio frequency (RF) oscillators and more particularly relates to RF oscillators able to generate RF carriers or modulated signals over a wide range of frequencies.

BACKGROUND OF THE INVENTION

Achieving wide band frequency coverage in conventional voltage controlled oscillators (VCOs) requires that the VCO have a wide tuning voltage range. This is often difficult to implement and also creates modulation-related problems in VCOs that are intended to be used for frequency modulation (either digital or analog). The implementation difficulties arise from voltage supply limitations and the modulation related problems arise due to the fact that a single tank circuit is used to determine the center frequency of the oscillator. In order to achieve a wide frequency range while maintaining a reasonable level of modulation sensitivity, i.e., tuning factor, a consequently wide tuning voltage range is required. VCOs having very wide tuning ranges are, however, generally difficult to construct. Usually, in order to achieve a wide frequency tuning range with a reasonable control voltage range, a VCO having a high tuning/modulation factor (in units of MHz/V) must be used.

A consequence of using a high tuning factor, i.e., a limited tuning voltage range, is that the tuning input of the VCO becomes highly sensitive to additive noise and more prone to extraneous signal pick up. This causes the phase noise level of the oscillator to increase resulting in the degradation of the performance of the system that incorporates the VCO. In addition, costly shielding may be required to prevent pick up of such noise.

When a modulating baseband signal is to be summed directly with the tuning voltage signal, or indirectly through a separate port affecting the center frequency of the oscillator's tank circuit, the resultant frequency deviation may vary as a function of the oscillator center frequency. The oscillator's center frequency is determined by the average, i.e., DC value, of the control voltage applied to the modulation/tuning input of the VCO. Note that both analog frequency modulation and digital Frequency Shift Keying (FSK) can be achieved by summing the tuning voltage signal and the baseband signal representing the input data signal.

In the majority of applications it is undesirable to have different tuning sensitivities at different points in the tuning range of the oscillator. Thus, the use of simple wide band oscillators is precluded as such devices typically exhibit this undesirable characteristic. Avoiding an oscillator having different tuning sensitivities within the tuning range typically requires the use of complicated circuitry or the addition of linearization circuits to alleviate the linearity problems associated with tuning and modulating a conventional oscillator over a wide frequency range.

One solution to this problem is to construct a VCO to have a narrow range of frequency coverage with a limited tuning voltage range, but which is capable of switching between frequency bands. The ability to switch between frequency bands permits the VCO to maintain a reasonable tuning/modulation factor within each of the frequency bands. This is typically realized by switching various components such as capacitors, inductors or variable-capacitors that are used in the tank circuit of the oscillator in and out of the circuit. The switching of the components causes the VCO to shift from one band to another. Thus, the frequency tuning range of the VCO is extended without extending the actual tuning voltage range (on a single variable capacitance diode for example) and without imposing a high tuning factor. Note that in addition to the switching elements themselves, e.g., RF PIN diodes, additional capacitors, inductors or variable capacitance diodes are typically necessary.

Oscillators with the capability of switching resonant frequencies are known in the art. U.S. Pat. No. 4,694,262, issued to Inoue et al., discloses an oscillation circuit consisting of a resonator and having a frequency switching means for switching the oscillation frequency of the resonator. The switching element used is a diode.

U.S. Pat. No. 4,536,724, issued to Hasegawa et al., discloses a VCO having an LC resonant circuit which includes a varactor circuit configured so as to control the resonant frequency by means of a DC bias control voltage applied to the varactor circuit.

Various types of well known oscillator circuits can be modified to achieve oscillation and frequency range shifts. Presented below are examples of prior art oscillators adapted to provide frequency range shifting. More detailed descriptions on the various prior art oscillators discussed below can be found in Chapter 5 of H. L. Krauss, C. W. Bostian and F. H. Raab, Solid State Radio Engineering, John Wiley, 1980.

A schematic diagram illustrating a prior art grounded base Colpitts oscillator adapted to provide frequency range switching is shown in FIG. 1. The basic oscillator circuit, generally referenced 10, comprises a transistor 32 and resonant circuit that consists of capacitors 24, 26, 30 and inductor 28. Applying a tuning voltage via resistor 14 to varactor 18 in series with capacitor 16 varies the frequency of oscillation. The frequency of oscillation can be modulated via a modulation input signal by varying the capacitance coupled to the emitter. A modulation input is applied to a varactor 36 in series with capacitor 34 and the emitter of transistor 32. The RF output of the circuit is the emitter voltage.

Note that the circuit described above is one representative possibility. In practice, the modulator circuit comprising capacitor 34, varactor 36 and resistor 38 can be connected across any frequency determining impedance, e.g., inductor 28 and capacitors 30, 34, 24 or 26.

The operating point of the transistor 32 is defined by a voltage divider (not shown) that defines the bias voltage of the transistor base. With this bias system and supply of collector voltage, the transistor is placed in an operating state in which it can provide amplification. Feedback capacitors connected from collector to emitter and from emitter to ground create a state in which connection of a parallel tuned circuit from collector to ground will give rise to electrical oscillations and the circuit becomes an oscillator. Since the feedback capacitors are effectively in parallel with the tuned circuit, the resultant capacitive loading greatly restricts the available tuning range available from this type of oscillator.

The shift in the frequency range is accomplished by switching a range shift capacitor 20 in and out of the circuit. The switching action is performed by diode 22, which may be a PIN, or regular diode. A range control signal is applied via resistor 12. When the range control signal is high, the diode is forward biased and functions to couple the capacitor 20 to ground. Adding the capacitance 20 to the circuit causes a shift in the resonant frequency. To remove the capacitor, a high impedance is applied to the range control input. During the positive half cycle of the RF, the capacitor 20 charges providing a current through forward biased diode 22. During the negative half cycle of the RF, the capacitor cannot discharge as the diode is reverse biased. After a few cycles of RF, the capacitor is charged and the current is reduced. Eventually, the current stops and the diode is no longer forward biased. At this point, the diode and the capacitor are effectively out of the circuit.

This may also be accomplished by applying a negative voltage at the range control input. It is important to note that the value of capacitor 20 is critical to the oscillation frequency. Capacitor 20, together with the other resonant components, determines the frequency of oscillation. Thus, to achieve accurate frequencies, a precision capacitor must be used which increases the cost of the circuit.

Note also that the schematic diagrams shown in FIGS. 1 through 5 present the AC equivalent circuit. The DC biasing has been left out for clarity sake.

A schematic diagram illustrating a prior art grounded base Hartley oscillator adapted to provide frequency range switching is shown in FIG. 2. The oscillator circuit, generally referenced 40, comprises a transistor 58 and a resonant circuit consisting of tapped inductor 54 and capacitors 56, 60. A varactor 48 in series with capacitor 46 provides tuning of the oscillation frequency. A tuning voltage is applied to the varactor 48 via resistor 44. The frequency of oscillation can be modulated via capacitor 60 coupled to the emitter of transistor 58 and in series with varactor 62. The modulation input signal is applied to the cathode of varactor 62 via resistor 64. The voltage on the emitter serves as the RF output.

The frequency range shift is accomplished by switching a capacitor 50 in and out of the circuit. The switching action is performed by diode 52, which may be a PIN, or regular diode. A range control signal is applied via resistor 42. When the range control signal is high, the diode is forward biased and functions to couple the capacitor 50 to ground. Adding the capacitance 50 to the circuit causes a shift in the resonant frequency. A negative voltage or high impedance is applied to the range control input to effectively remove the capacitor from the circuit.

Similarly with the circuit of FIG. 1, the value of capacitor 50 is critical to the oscillation frequency. Capacitor 50, together with the other resonant components, determines the frequency of oscillations thus requiring a precision capacitor to be used.

A schematic diagram illustrating a prior art grounded base Clapp oscillator adapted to provide frequency range switching is shown in FIG. 3. The basic oscillator circuit, generally referenced 70, comprises a transistor 90 and resonant circuit which consists of capacitors 84, 86, 88 and inductors 76, 92. Applying a tuning voltage via resistor 74 to varactor 78 that is in series with inductor 76 varies the frequency of oscillation. The frequency of oscillation can be modulated via a modulation input signal by varying the capacitance coupled to the emitter. A modulation input signal is applied to a varactor 98, which is in series with capacitor 94 and the emitter of transistor 90. The RF output of the circuit is taken from the collector.

Inductor 89 together with capacitor 88 form a parallel resonant circuit functioning as a harmonic band pass filter. This enables the oscillator to output a signal at a desired harmonic of the frequency at which the oscillator oscillates. This is useful especially when a desired frequency at the output cannot be easily realized for practical reasons when using this type of resonator.

The shift in the frequency range is accomplished by switching a range shift capacitor 80 in and out of the circuit. The switching action is performed by diode 82, which may be a PIN, or regular diode. A range control signal is applied via resistor 72. When the range control signal is high, the diode is forward biased and functions to couple the capacitor 80 to ground. Adding the capacitance 80 to the circuit causes a shift in the resonant frequency. A high impedance or negative voltage is applied to the range control input to effectively remove the capacitor from the circuit.

It is important to note that the value of capacitor 80 is critical to the oscillation frequency. Capacitor 80, together with the other resonant components, determines the frequency of oscillations. Thus, to achieve accurate center frequencies, a precision capacitor must be used which increases the cost of the circuit.

A schematic diagram illustrating a prior art modified Clapp oscillator adapted to provide frequency range switching is shown in FIG. 4. The basic oscillator circuit, generally referenced 100, comprises a transistor 120 and resonant circuit, which consists of capacitors 116, 118 and inductor 114. Applying a tuning voltage via resistor 104 to varactor 108, which is in series with capacitor 106, varies the frequency of oscillation. The frequency of oscillation can be modulated via a modulation input by varying the capacitance coupled to the emitter. A modulation input is applied to a varactor 126, which is in series with capacitor 124 and the emitter of transistor 120. The RF output of the circuit is the emitter voltage.

The oscillator 100 is also based on a transistor amplifier. In this circuit, however, the tuning of the circuit is achieved by subtracting the capacitive reactance of the voltage variable capacitance of the tuning diode 108 from the inductive reactance of the tuning inductor 114. The net result being an inductive reactance that resonates with the feedback capacitors as a parallel tuned circuit.

The shift in the frequency range is accomplished by switching a range shift capacitor 110 in and out of the circuit. The switching action is performed by diode 112, which may be a PIN, or regular diode. A range control signal is applied via resistor 102. When the range control signal is high, the diode is forward biased and functions to couple the capacitor 110 to ground. Adding the capacitance 110 to the circuit causes a shift in the resonant frequency. A negative voltage or high impedance is applied to the range control input to effectively remove the capacitor from the circuit.

It is important to note that the value of capacitor 110 is critical to the oscillation frequency. Capacitor 110, together with the other resonant components, determines the frequency of oscillations. Thus, to achieve accurate center frequencies, precision capacitors must be used, which increases the cost of the circuit.

It is important to note that the quality factor and the precision of the capacitor values shown in the circuits of FIGS. 1 to 4 are critical to the operation of the oscillators and have cost implications.

SUMMARY OF THE INVENTION

The present invention is a frequency synthesized oscillator having the ability to switch frequency between two or more frequency ranges. The range switchable oscillator has applications in any circuit utilizes an oscillator whereby it is desirable that the oscillator be tunable over a wide frequency range. Such applications include, but are not limited to, phase lock loop circuits and time-division-duplex (TDD) wireless transceivers for two-way communications. The invention has applications in frequency hopping transceiver applications as well. In such an application a first frequency range is used to generate the transmission carrier frequencies while a second frequency range is used to generate the local oscillator frequencies used in the receiver portion. The receiver local oscillator frequencies may be higher or lower than the transmission frequencies by an amount equal to the system's first IF (intermediate frequency).

Another application in which the invention may be implemented is in a transmitter or receiver wherein two or more bands require coverage but with a limited range of tuning voltage to be applied to the tuning input of the oscillator. Typically, it is not required to generate frequencies in between these bands, i.e., the frequency coverage is not continuous. The scope of the invention, however, is not limited to such applications. The invention is applicable in any oscillator circuit where a relatively wide frequency range requires continuous coverage. The coverage is split among two or more frequency bands or ranges.

Utilizing a tapped inductor as the inductor element of the oscillator provides the frequency range switching capability of the invention. In a first embodiment, a tapped coil inductor is utilized. In a second and preferred embodiment, a tapped printed transmission line is used. In addition, in comparison with a conventional modified Clapp oscillator, the locations of the inductor and capacitor in the oscillator of the present invention are swapped relative with those in the prior art oscillator. In a third embodiment, the oscillator is constructed to provide a plurality of frequency ranges.

Although the range switching portion of the present invention is shown applied to one particular type of oscillator, one skilled in the RF arts can apply the invention to many of the known oscillator configurations, some of which were given as examples in the Background section of this document.

A typical application in which the implementation of the present invention is advantageous is in an integral radio transmitter/receiver where the same oscillator used for modulating the transmitted signal is also used to generate the local oscillator signal required for frequency conversion in the receiver. In such a transceiver, where transmission and reception are not simultaneous, i.e., TDD, the oscillator is required to provide a subset of frequencies during transmission and a different subset of frequencies during reception in accordance with the frequency conversion scheme of the receiver.

There is thus provided in accordance with the present invention a voltage controlled oscillator (VCO) having a plurality of frequency bands comprising resonator means comprising a capacitance and an inductance, the inductance comprising a tapped inductor, frequency range switching means coupled to the resonator means, the frequency range switching means operative to switch the range of oscillation frequencies of the VCO in accordance with a range control signal, tuning means operative to vary the frequency of oscillation of the VCO within a frequency range in accordance with a tuning voltage input thereto, amplifier means connected to the resonator for generating an oscillation signal as determined by the resonator and feedback means connected to the amplifier means and adapted to ensure the oscillation of the VCO.

The tapped inductor may comprise a lumped inductance, a printed inductance, a combination of printed and lumped inductances or an inductance constructed from microstrip line. One end of the inductor is connected to ground and both ends of the inductor are floating. The frequency range switching means comprises a DC blocking capacitor and a switching element and the switching element comprises a diode.

The frequency range switching means may be adapted to receive a plurality of range control signals thus providing the ability to switch between multiple frequency ranges. The frequency range switching means comprises a plurality of DC blocking capacitors and a plurality of switching elements, a separate DC blocking capacitor and switching element associated with each of the frequence range.

There is also provided in accordance with the present invention a voltage controlled oscillator (VCO) having a plurality multiple frequency bands comprising resonator means comprising a capacitance and an inductance, the inductance comprising a printed inductor one end of which is connected to ground, frequency range switching means coupled to the printed inductor at a tap point the frequency range switching means operative to short a portion of the inductor to ground, in response to a range control signal, thereby switching the range of oscillation frequencies of the VCO, tuning means operative to vary the frequency of oscillation of the VCO within a frequency range in accordance with a tuning voltage input thereto, amplifier means connected to the resonator for generating an oscillation signal as determined by the resonator and feedback means connected to the amplifier means and adapted to ensure the oscillation of the VCO.

The frequency range switching means comprises a DC blocking capacitor and a switching element that may comprise a diode. The tuning means comprises a varactor diode.

There is further provided in accordance with the present invention an RF transceiver comprising an oscillator comprising resonator means comprising a capacitance and an inductance, the inductance comprising a tapped inductor;, frequency range switching means coupled to the resonator means, the frequency range switching means operative to switch the range of oscillation frequencies of the VCO in accordance with a range control signal, tuning means operative to vary the frequency of oscillation of the VCO within a frequency range in accordance with a tuning voltage input thereto, amplifier means connected to the resonator for generating an oscillation signal therefrom, feedback means connected to the amplifier means and adapted to ensure the oscillation of the VCO, receiver circuitry coupled to an antenna, the receiver circuitry for receiving and demodulating an RF signal and transmitter circuitry coupled to an antenna, the transmitter circuitry for modulating an RF carrier derived from the oscillator.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| AC | Alternating Current |
| BPF | Band Pass Filter |
| DC | Direct Current |
| FM | Frequency Modulation |
| FSK | Frequency Shift Keying |
| IF | Intermediate Frequency |
| LC | Inductance/Capacitance |
| LNA | Low Noise Amplifier |
| PLL | Phase Locked Loop |
| RF | Radio Frequency |
| TDD | Time Division Duplex |
| VCO | Voltage Controlled Oscillator |

General Description

The oscillators shown throughout this document are of a class of oscillators known as negative resistance oscillators. A device displays negative resistance if in any portion of its V-I characteristics, its slope is negative, i.e., as the voltage decreases, the current through the device increases. Various semiconductor devices are known to exhibit such negative resistance characteristics including, for example, tunnel diodes, thyristors, diacs, Gunn diodes and unijunction transistors. To construct an oscillator, a resonant circuit is connected across a negative resistance. Oscillations begin due to shot and thermal noise. The amplitude of oscillations will grow until the power delivered by the circuit is equal to the power absorbed. This equilibrium point is reached only for a specific frequency and it is at this frequency that the circuit will oscillate.

The oscillators used herein to illustrate the principles of the present invention are of the feedback type. Note, however, that the scope of the present invention is not limited to feedback oscillators or negative resistance oscillators. One skilled in the RF oscillator arts can apply the principles of the present invention to any oscillator that incorporates an inductive element in the resonant portion of its circuit.

Figure 1:
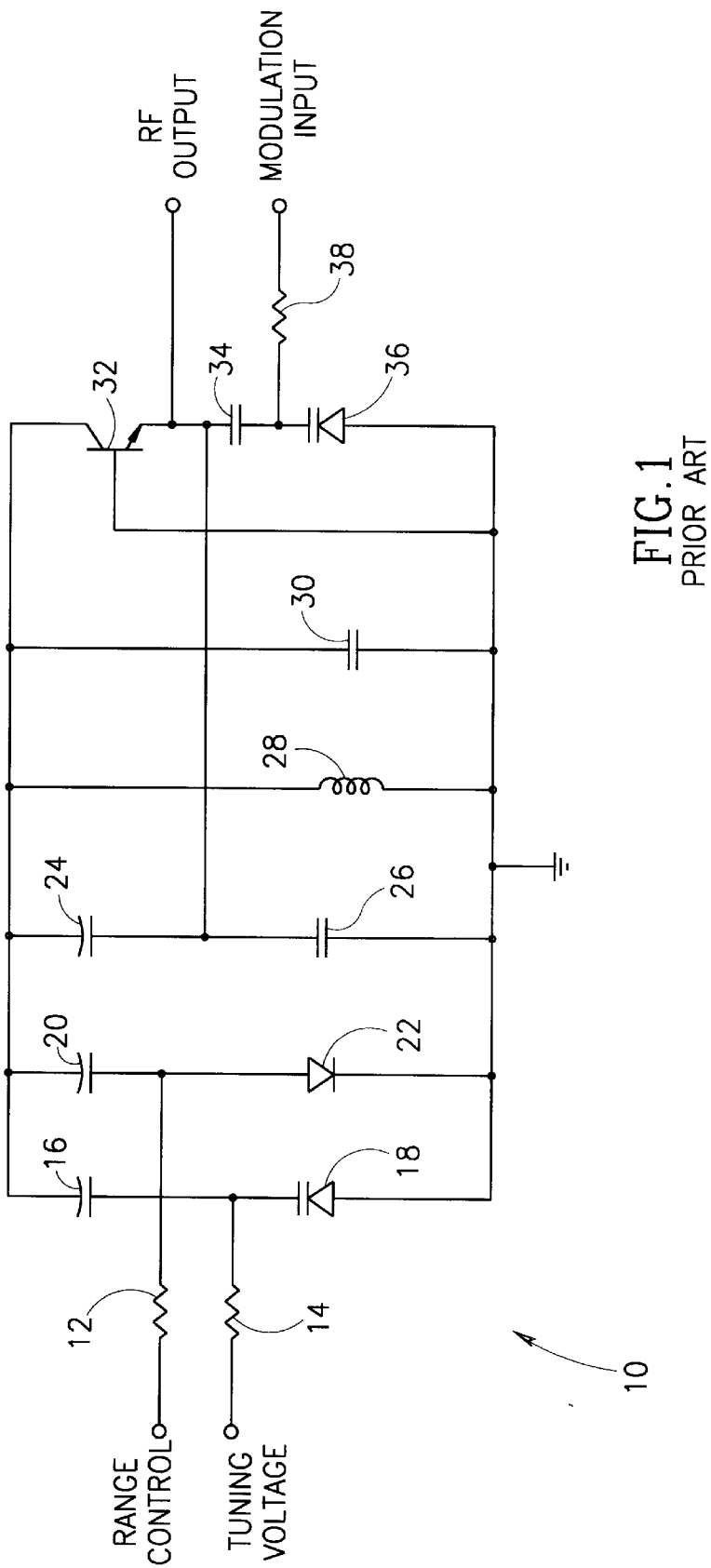
FIG. 1 is a schematic diagram illustrating a prior art grounded base Colpitts oscillator adapted to provide frequency range switching.
Figure 2:
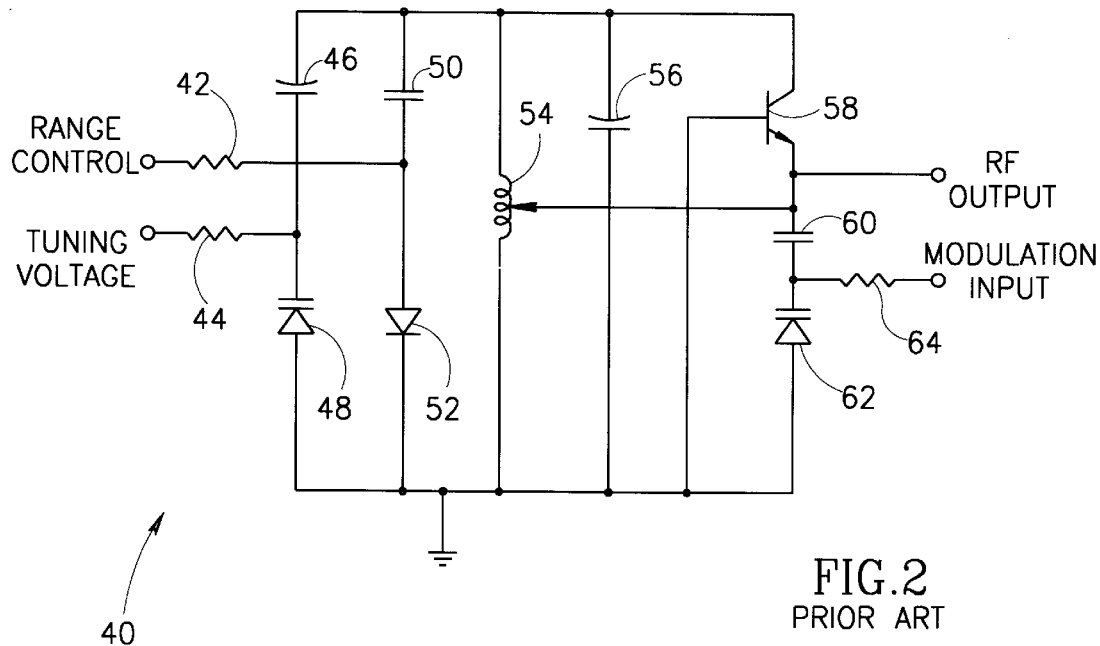
FIG. 2 is a schematic diagram illustrating a prior art grounded base Hartley oscillator adapted to provide frequency range switching.
Figure 3:
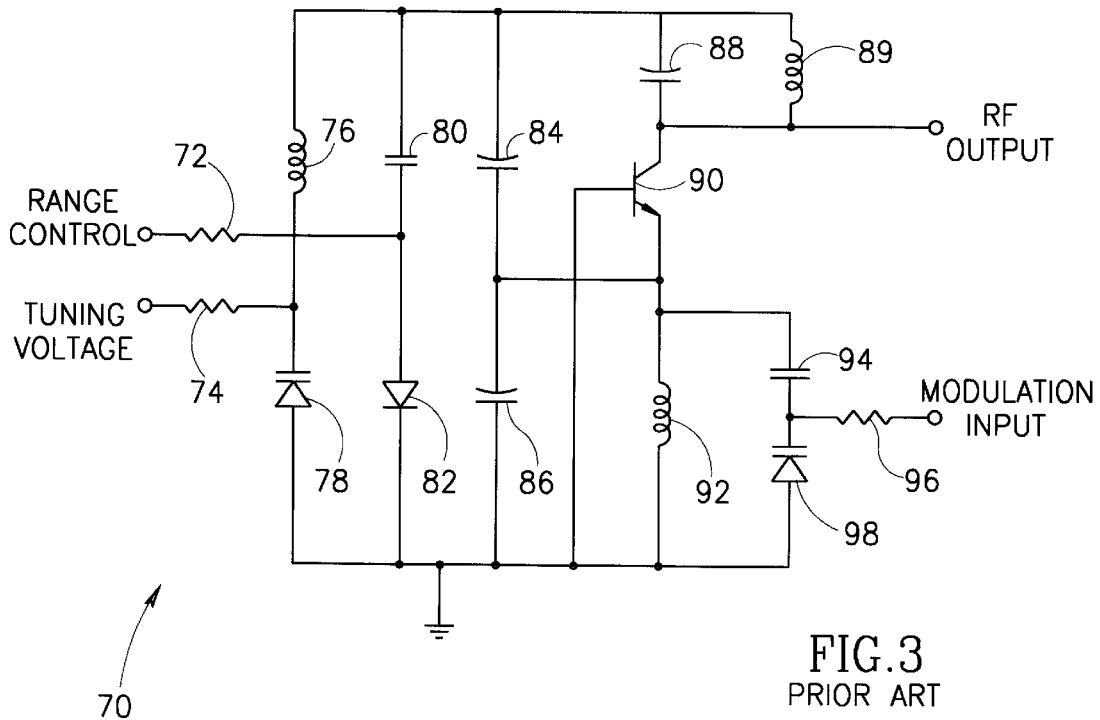
FIG. 3 is a schematic diagram illustrating a prior art grounded base Clapp oscillator adapted to provide frequency range switching.
Figure 4:
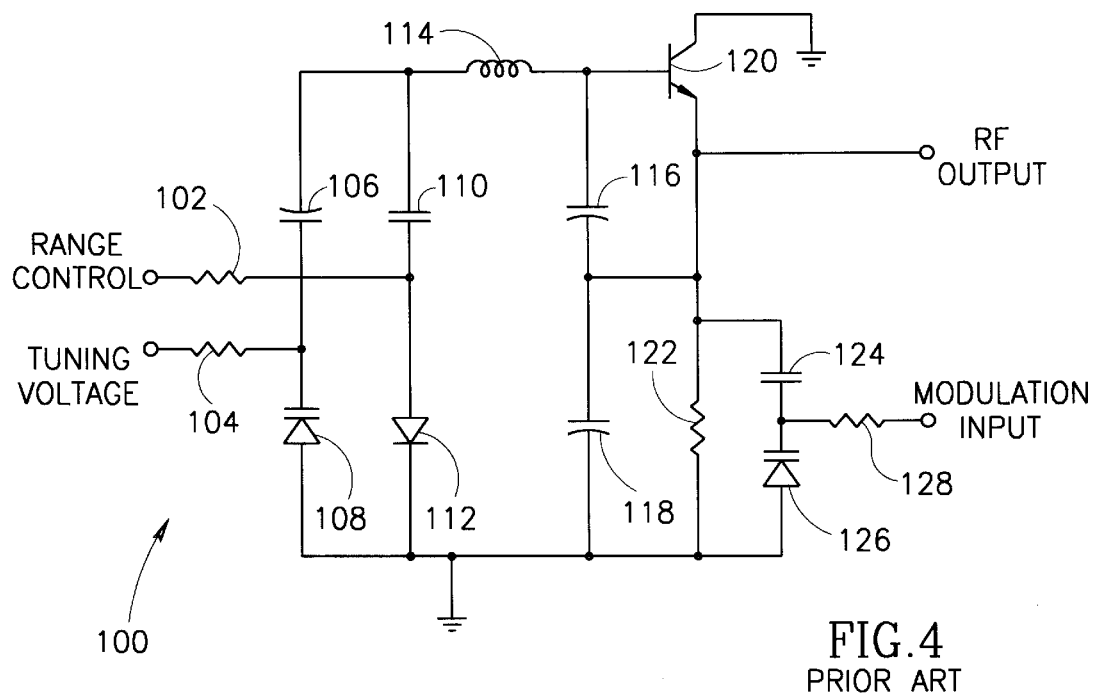
FIG. 4 is a schematic diagram illustrating a prior art modified Clapp oscillator adapted to provide frequency range switching.
Figure 5:
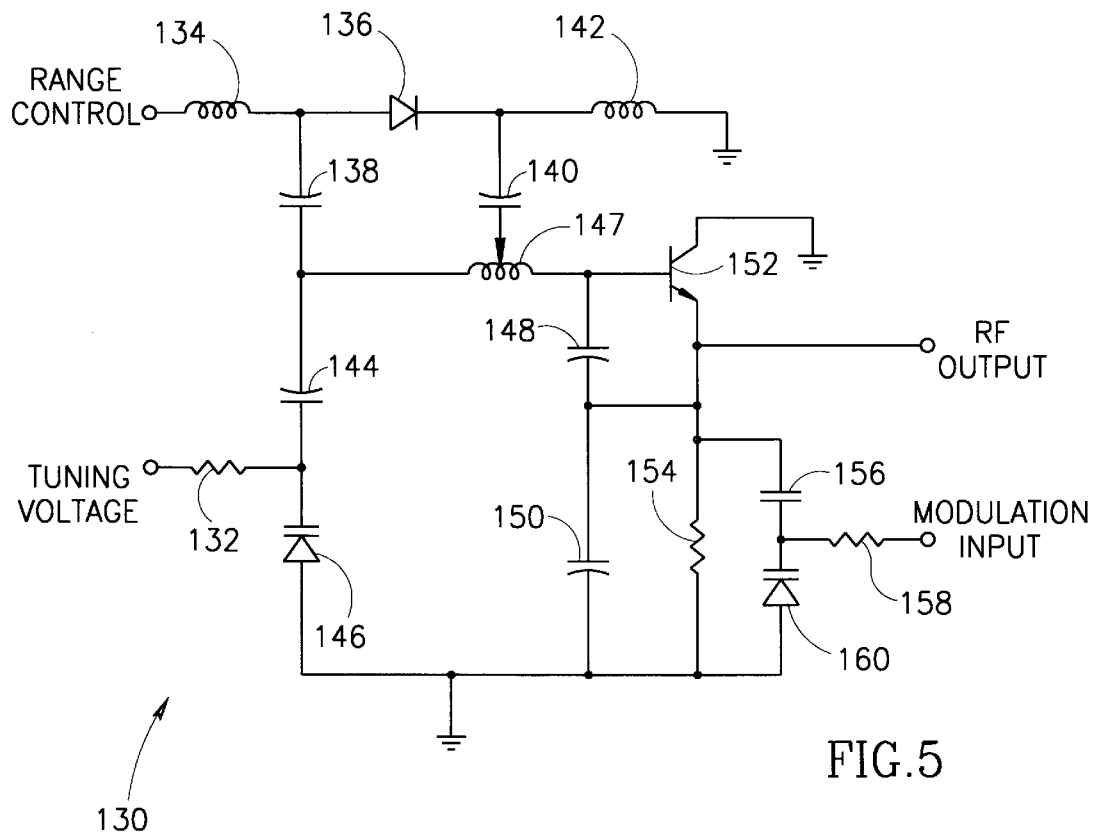
FIG. 5 is a schematic diagram illustrating a first embodiment of the oscillator of the present invention wherein a wire wound coil inductor is tapped to provide frequency range switching.

A schematic diagram illustrating a first embodiment of the range switched oscillator of the present invention wherein an inductor is tapped to provide frequency range switching is shown in FIG. 5. The oscillator, generally referenced 130, comprises a transistor 152 and resonant components consisting of tapped inductor 147 and capacitors 144, 148, 150. The circuit 130 also comprises a varactor 146 in series with capacitor 144, which provides tuning of the frequency of oscillation. A tuning voltage is applied to the cathode of the varactor 146 via resistor 132.

This oscillator configuration is used to illustrate the principles of the present invention. The present invention is not limited to this configuration as other configurations of oscillators or VCO circuits are also intended to be within the scope of the present invention.

In the configuration shown herein, the transistor 152 is used in a common collector configuration. In the present invention, the parasitic capacitance effects are reduced to a minimum by rearranging the circuitry so that they appear in series with the tuning elements rather than in parallel thus reducing their effects significantly. Resistor 154 is connected from the emitter of transistor 152 to ground. The base of the transistor is connected to a bias voltage generated at the junction of two resistors (not shown). A very small capacitor from emitter to base is sufficient in order to create instability in the circuit and ensure oscillations at a frequency which is determined by the net inductance of the network, the emitter capacitors and the intrinsic base emitter capacitance of the transistor.

The frequency of oscillation can be modulated, to provide analog FM or digital FSK for example, by applying the modulation input signal, via resistor 158, to a varactor 160 connected to the emitter of transistor 152 through series capacitor 156. The voltage on the emitter serves as the RF output of the circuit.

Applying a range control signal to the anode of diode 136 performs the frequency range switching. The diode 136 is configured to short out a portion of the coil making up the inductor 147. Since the range control signal is a DC voltage, DC blocking capacitors 138 and 140 are required between the diode 136 and the inductor 147. For RF signals, the capacitors 138, 140 are negligible impedances. Chokes 134, 142 function to isolate the RF signals of inductor 147 terminals from the range control input and ground, respectively. Without the choke coils, the range control circuitry would interfere with the oscillator circuit, changing the frequency of oscillation. The chokes thus isolate the circuit, RF wise, from the range control signal and associated circuitry.

With the range control signal floating, i.e., disconnected, the diode is not forward biased and is effectively out of the circuit. The fill length of the coil 147 is then in the circuit. When a signal is applied to the range control input, the diode is forward biased and functions to short out a portion of the inductor 147, thus raising the frequency of oscillation. A disadvantage of this circuit, however, is the extra components required to switch the tapped portion of the inductor in and out of the circuit.

Figure 6:
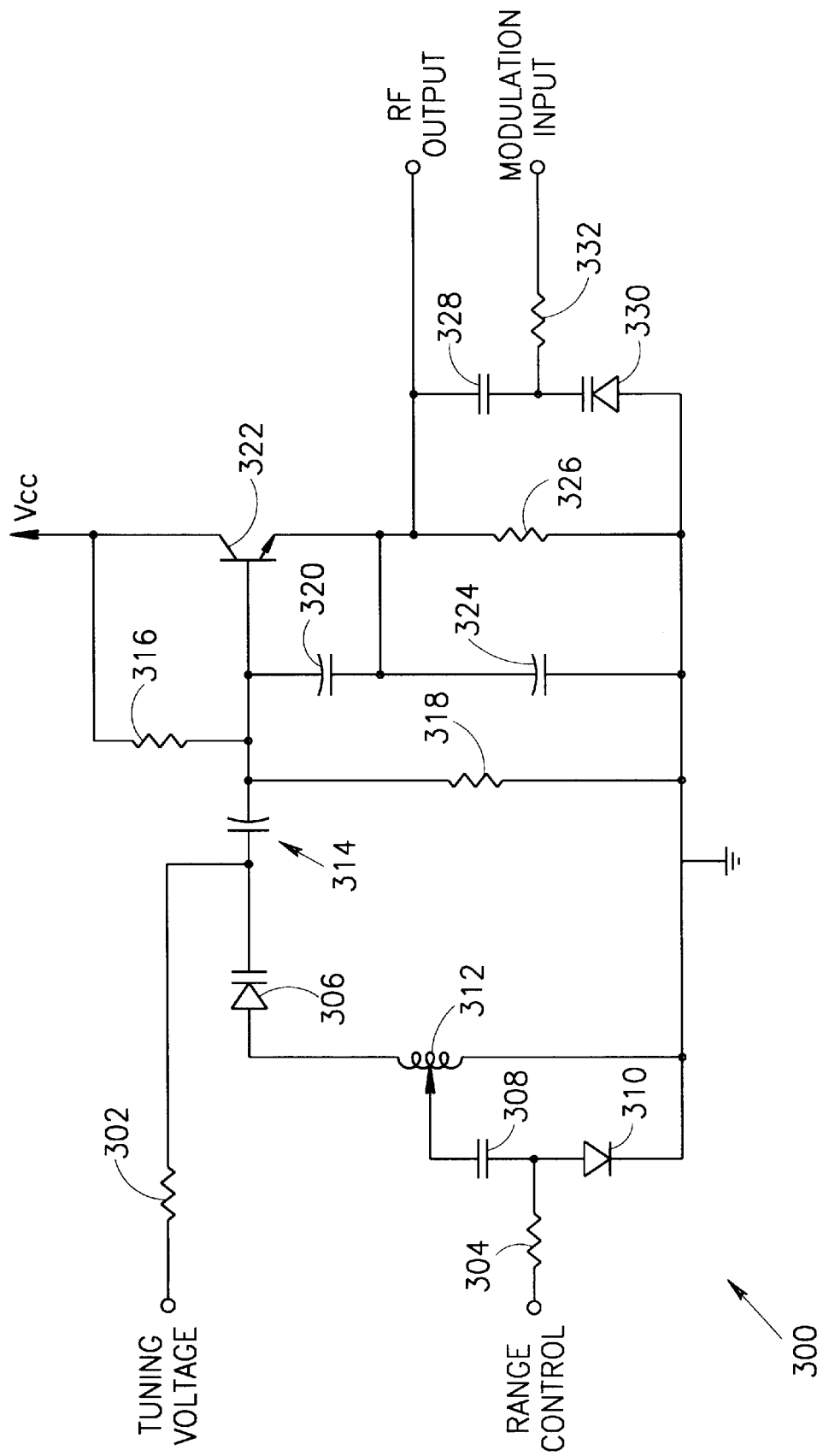
FIG. 6 is a schematic diagram illustrating a second embodiment of the oscillator of the present invention wherein a wire wound coil inductor is tapped to provide frequency range switching and wherein the frequency determining components are interposed.

A schematic diagram illustrating a second embodiment of the oscillator of the present invention wherein a wire wound coil inductor is tapped to provide frequency range switching and wherein the frequency determining components are interposed is shown in FIG. 6. The second embodiment of the present invention also utilizes a tapped inductor in conjunction with interposed frequency determining components. The oscillator, generally referenced 300, comprises a transistor 322 and resonant components which include a tapped inductor 312 and capacitors 314, 320, 324. The circuit 300 also comprises a varactor 306 in series with capacitor 314 that provides operating frequency tuning. A tuning voltage is applied to the cathode of the varactor 306 via resistor 304. Those skilled in the art will recognize that other techniques of applying a tuning voltage can also be used, as the invention is not limited to the techniques shown herein.

The oscillator configuration 300 shown in FIG. 6 is used to illustrate a key principle of the present invention. Note, however, that the present invention is not limited to this configuration of oscillator as other oscillator configurations or VCO circuits are also contemplated to be within the scope of the invention.

In the configuration shown herein, the transistor 322 is used in a common collector configuration. The feedback capacitance effects in the circuit 300 are reduced to a minimum by rearranging the circuit components such that they are situated in series with the tuning elements rather than in parallel which functions to significantly reduce their influence. Resistor 326 is connected from the emitter of transistor 322 to ground. The base of the transistor is connected to a bias voltage generated at the junction of resistors 316, 318. A relatively small capacitance from emitter to base is sufficient to establish a state of instability in the circuit and ensure the onset of oscillations at a frequency determined by the net inductance of the network, the emitter capacitors and the intrinsic base-emitter capacitance of the transistor.

A modulation signal is optionally applied to provide either analog or digital FSK. For example, a modulation signal can be applied via resistor 332 to varactor 330 that is connected to the emitter of the transistor via series capacitor 328. The RF output signal can be taken from emitter of the transistor 322.

Applying a range control signal to the anode of diode 310 performs the frequency range switching function. The diode 310 is configured to short out a portion of the inductor 312. Since the range control signal is a DC voltage, a DC blocking capacitor 308 is required. In this case, however, its actual capacitance and tolerance bears little effect on the frequency accuracy of the oscillator 300. In addition, since the capacitor 308 is connected to a low impedance point in the circuit, the quality (Q factor) of the capacitor has less of an effect on the operation of the circuit.

In addition to the capacitor, only an additional resistor is needed to complete the circuit as compared with at least two RF choke inductors and two DC blocking capacitors required in the circuit of FIG. 5.

When the range control signal is removed, the diode becomes reverse biased by rectifying the RF voltage developed across the tank circuit and charging the capacitor 308 to the peak RF voltage in the circuit. Once the capacitor is charged, conduction ceases through the branch containing the diode 310 and capacitor 308. Thus, the branch is effectively removed from the circuit. When the control signal is applied to the circuit, the diode 310 conducts, effectively placing an AC short circuit across a portion of the inductor 312, thus raising the operating frequency of the oscillator.

A key advantage of the present invention is that since the diode operates in a self biasing circuit, the diode can be a general purpose diode as long as its transition frequency is high enough to be able to detect, i.e., rectify, the RF signal appearing across the tuned circuit. In contrast, prior art circuits required special purpose PIN diodes or their equivalents that are more expensive, more difficult to obtain and require more complicated control circuitry.

Figure 7:
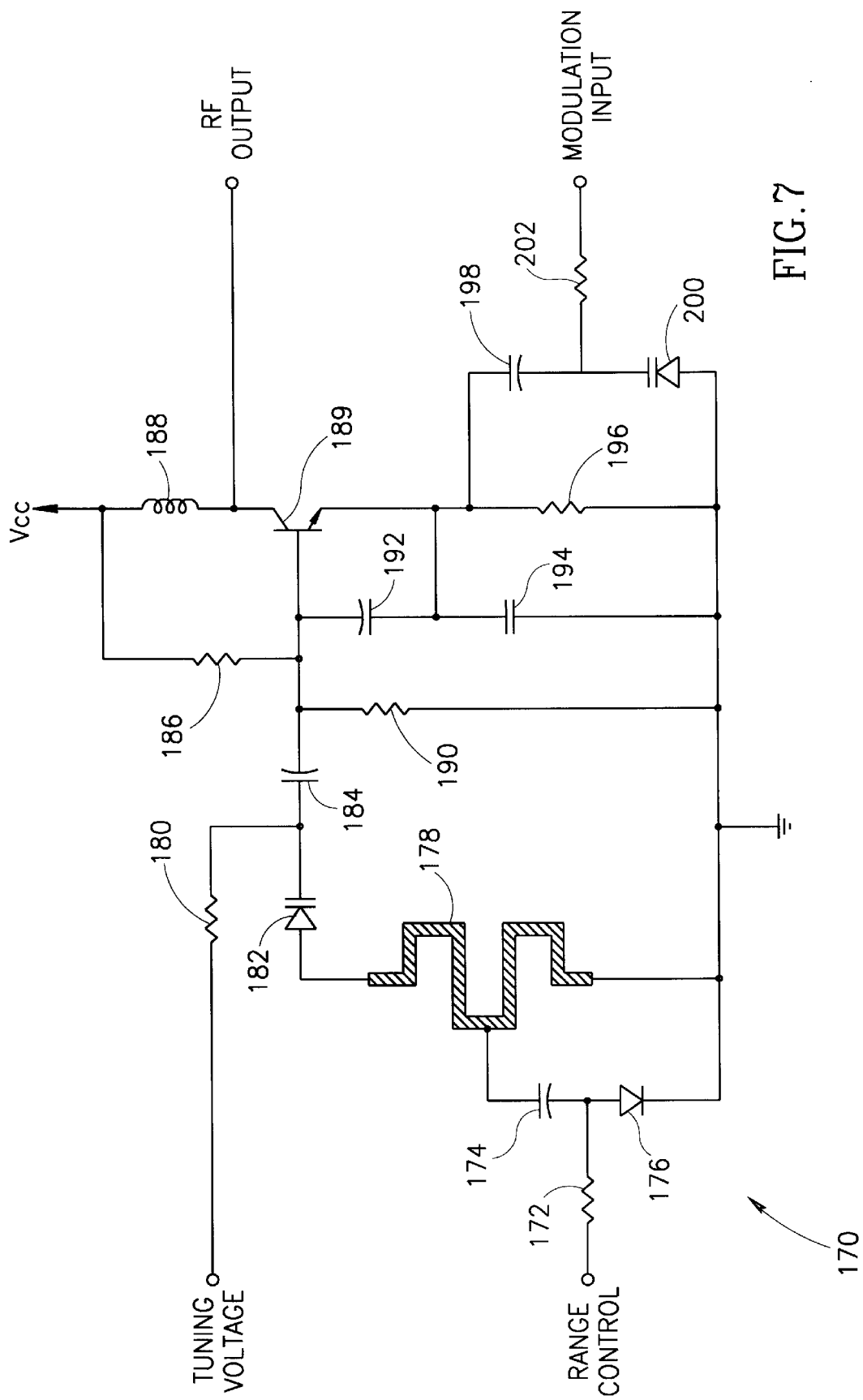
FIG. 7 is a schematic diagram illustrating a third embodiment of the oscillator of the present invention wherein an inductor is tapped to provide frequency range switching and wherein the frequency determining components are interposed.

In a third embodiment, these disadvantages are overcome by using a printed inductor rather than a coil inductor. Here too, the location of the inductor is moved such that one end is grounded while the other end remains floating. A schematic diagram illustrating a third embodiment of the oscillator of the present invention wherein an inductor is tapped to provide frequency range switching is shown in FIG. 7. The oscillator circuit, generally referenced 170, has a configuration similar to that shown in FIG. 6. The circuit 170 comprises a transistor 189 and resonant components comprising inductor 178 and capacitors 184, 192, 194. Resistors 186, 190 form a resistor divider for DC biasing the base of transistor 189.

The collector is connected to $V_{CC}$ through inductor 188. The RF output is taken from the collector. Note that alternatively, the RF output may be taken from the emitter. In this case, which is similar to the circuit of FIG. 5, the collector is grounded. A modulation input signal functions to modulate the oscillator frequency via varactor 200, which is connected to the emitter through capacitor 198. The modulation input signal is applied to varactor 200 via resistor 202.

The inductor 178 preferably comprises a printed inductor, which is grounded at one end and connected to varactor 182 on the other. Shorting a portion of the inductor to ground performs the frequency range shift. A series combination of the switching element 176 and capacitor 174 is connected between ground and a tap point on the printed inductor 178. The range control signal is applied to the diode 176 via resistor 172. The switching element may comprise any suitable switching device such as a general purpose signal diode or a PIN diode.

When the range control signal is high, i.e., a sufficiently high voltage is applied, the diode is forward biased and functions to couple the capacitor 174 to ground, thus shorting a portion of the inductor 178. The change in value of the inductance causes a shift in the frequency of oscillation of the oscillator circuit 170. The short to ground is removed by applying a negative voltage or high impedance to the range control input. When the range control input is disconnected (high impedance), initially the capacitor 174 conducts current and keeps the diode forward biased. A point is finally reached, however, where the current through the capacitor ceases and the diode becomes self biased (reverse biasing), at which point the capacitor and diode are effectively disconnected from the circuit.

Capacitor 174 and diode 176 may be swapped whereby the anode of the diode remains connected to the range control input and the cathode is connected to the tap point on the inductor 178. In this configuration, a voltage applied to the tuning control input forward biases the diode thus coupling the tap point on the inductor to ground. In addition, the capacitor functions to ground RF signals even when the tuning control input is high impedance.

The inductor 178 is connected in series with the tuning element, which comprises varactor 182, and capacitor 184. The tuning voltage is applied to the cathode of the varactor 182 via resistor 180.

By interposing the phase shifting line and the tuning diode between the base of the transistor and ground, it is possible to place a short circuiting element, e.g., a diode, from an arbitrary point on that line to ground. By closing this switch one can effectively shorten the phasing line so that the conditions for oscillation are fulfilled at a higher frequency without the need of applying an excessive voltage at the tuning voltage control port.

A key aspect of the present invention comprises the swapping of the location of the varactor/capacitor combination and the inductor from their conventional location in a series tuned circuit. This provides several benefits. First, it eliminates the problems associated with utilizing the DC blocking capacitors and RF blocking choke coils that are required when the inductor is tapped and used in the floating position.

Second, the tap point on the inductor is moved to a lower impedance point as compared with the tap point on the inductor when it is floating in the circuit (FIG. 5). Moving the tap point to a lower impedance point functions to reduce the pickup of noise and extraneous signals by the inductor.

Note that the inductance 178 may comprise a tapped coil inductor or preferably, a printed inductor or combination of both types. If a coil inductor is utilized, several points should be kept in mind. Shorting a portion of a coil will introduce parasitic resonance into the circuit. In addition, if too much of the coil is shorted, the Q factor of the coil is lowered, as the shorted and unshorted portions are both located on the same core. Use of a stripline, i.e., printed, inductor avoids the above drawbacks.

Further, when the tapped inductor is in the position as shown in FIG. 6, even when a portion of the inductor is bypassed, the bypassed portion still acts as an antenna picking up extraneous signals. Since both portions, i.e., bypassed and non bypassed, are on the same core, mutual coupling causes noise picked up on one portion to be coupled to the other.

In addition, lowering the impedance point causes the circuit to be less sensitive to the limitations of other components. For example, capacitor losses and inductance leakages have less of an effect on the operation of the circuit. This benefit is derived from the fact that one end of the inductor 178 is grounded rather than both ends floating, thus lowering the impedance point of the inductor and improving the Q factor of the circuit.

Note that the swapping of the inductor and capacitor locations does not degrade the operation of the circuit from a RF point of view. In actuality, performance is improved since the inductor, as compared to the capacitor, is typically the larger impedance, the noise pickup is therefore reduced by grounding one end of the inductor, rather than leaving both ends floating as in the prior art oscillator circuits.

Further, the range switching means connected to the inductor, i.e., resistor 172, capacitor 174, diode 176, performs better from a DC point of view as compared with the extra passive components required to perform the bypass of a portion of the inductor shown in FIG. 5.

A further advantage of the circuit of FIG. 7 is that the capacitor 174 does not control the frequency of oscillation of the circuit 170 and thus its value is not critical. This is in contrast to the role of the capacitors connected in series with the switching element in the prior art circuits shown in FIGS. 1 to 4. The capacitor 174 is used only for DC blocking of the range control voltage applied to the anode of the diode 176.

Figure 8:
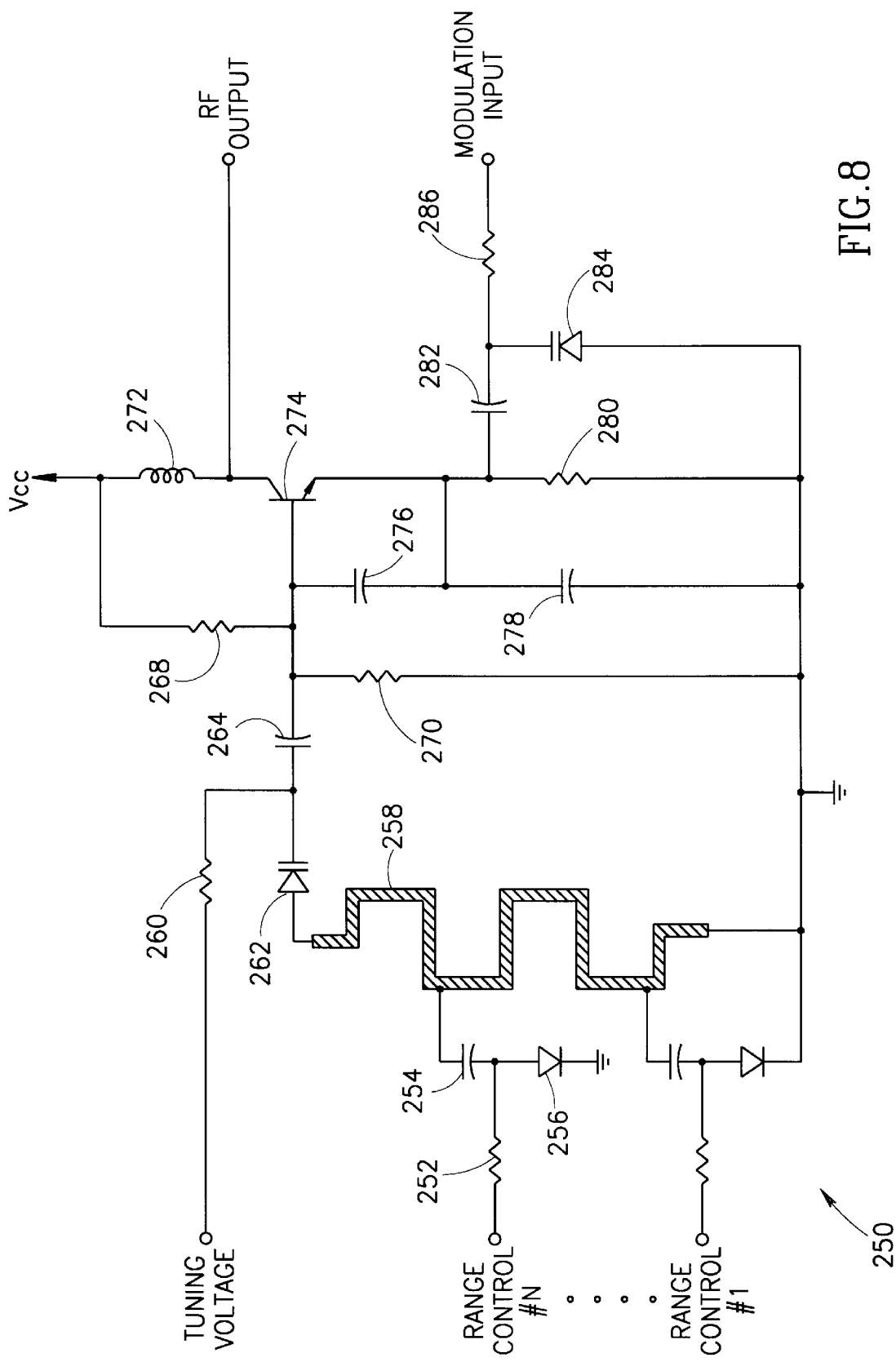
FIG. 8 is a schematic diagram illustrating an example transceiver constructed utilizing the oscillator of the present invention.

A schematic diagram illustrating a fourth embodiment of the oscillator of the present invention wherein an inductor has a plurality of taps thus providing a plurality of frequency ranges is shown in FIG. 8. In this embodiment, the frequency band of the oscillator, generally referenced 250, is widened into a plurality of bands or frequency ranges. The oscillator circuit 250 is similar to that of FIG. 7 with the exception that in oscillator 250, the inductance 258 contains a plurality of taps. Each of the N taps comprises a DC blocking capacitor 254, switching diode 256 and a resistor 252. Range control signal inputs #1 through #N are coupled to respective tap circuits.

In operation, N frequency ranges are obtainable. To select a particular frequency range, one of the range control signals is set high. This couples the particular portion of the inductor corresponding to that tap to ground. If more than one range control is high, the highest range control input, i.e., the range control associated with the tap furthest from ground, is the one that dominates.

It is important to note that in each of the oscillators of FIGS. 5, 6, 7 and 8, the switched element is the oscillator's resonator, which is preferably an inductive printed element on the printed circuit board (PCB). Due to the fact that it is printed and not a lumped packaged component, any point along it may be accessed, thus enabling the use of any portion of it as separate inductors each having an inductance proportional to its length. Thus, the frequency band switching is not limited to standard values of lumped inductors. This eliminates the need for additional inductors to cover additional bands in an oscillator with the associated cost savings.

Further, the printed elements are typically of high accuracy and repeatability, which reduces tolerance and yield related problems during manufacture. A portion of the inductance may be lumped if the minimal value that is necessary to obtain the desired center frequency is relatively high and a printed realization of such an inductance is problematic.

Figure 9:
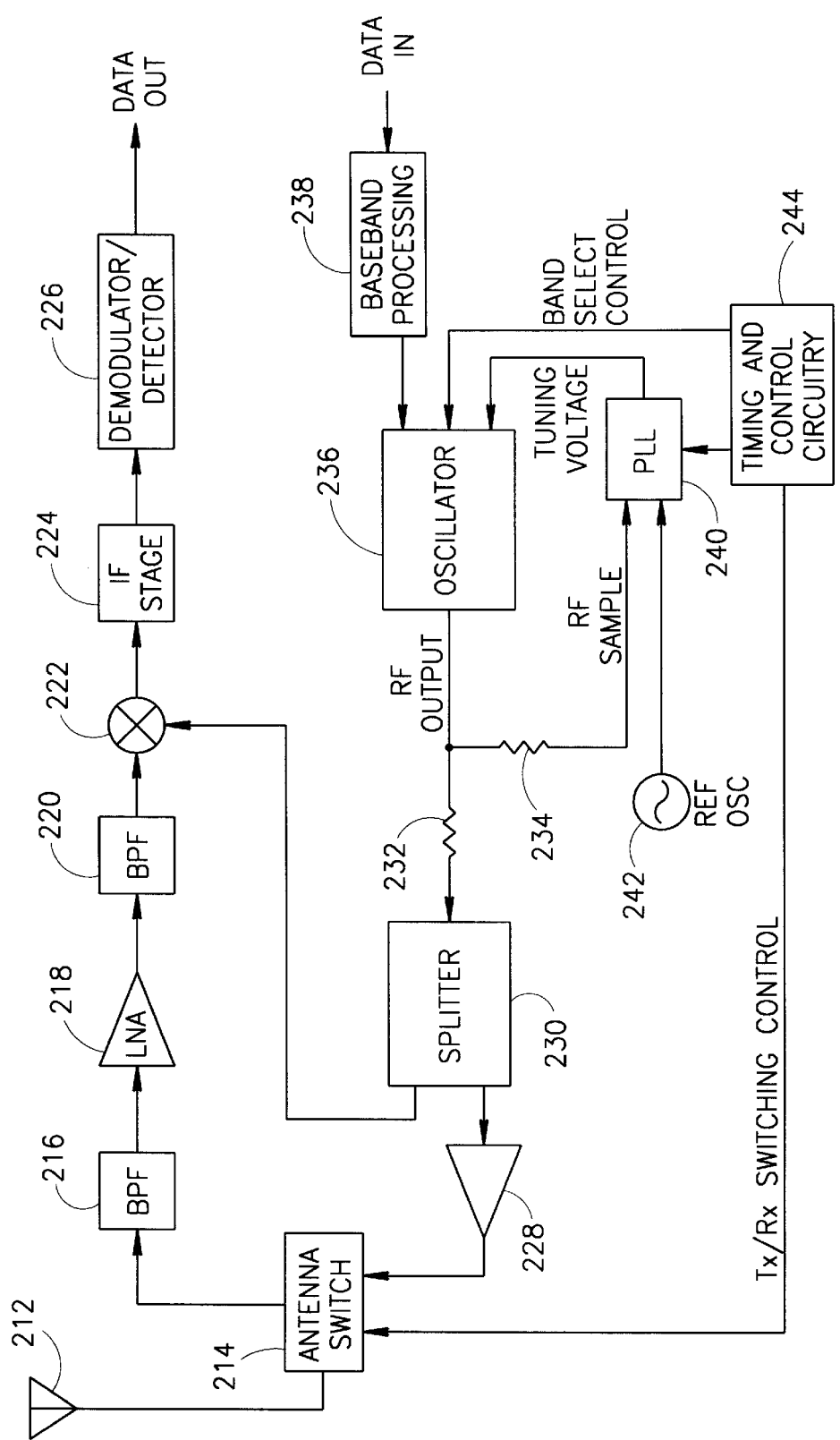
FIG. 9 is a schematic diagram illustrating a fourth embodiment of the oscillator of the present invention wherein an inductor has a plurality of taps thus providing a plurality of frequency ranges.

A schematic diagram illustrating an example transceiver constructed utilizing the oscillator of the present invention is shown in FIG. 9. The transceiver circuit, generally referenced 210, comprises a receive and a transmit portion. A receive signal is received by antenna 212 and passed via antenna switch 214 to the LNA 218 after being filtered by BPF 216. The output of the amplifier 218 is filtered by BPF 220 before being mixed via mixer 222 with the local oscillator signal generated by the oscillator 236. The IF signal output from the mixer 222 is processed by the IF stage 224. The signal output of the IF stage is demodulated by the demodulator/detector 226 which functions to reproduce the transmitted data signal.

The input data to be transmitted is input to baseband processing 238 which outputs a modulation input signal that is applied to the oscillator 236. The RF output of the oscillator 236 is input to a splitter 230 and forms a RF sample input to PLL 240. A reference oscillator 242 is also input to the PLL whose output is looped back to the tuning voltage input of the oscillator. Control circuitry 244 functions to determine the frequency of oscillation by applying a control signal to the PLL 240 and controls the timing of transmission and reception. Another control signal output by the control circuitry controls the frequency range of the oscillator.

One output of the splitter 230 is input to the mixer 222 and the other output is input to the power amplifier 228. The output of the amplifier 228 is input to the antenna switch 214. At any one time, the transceiver is either transmitting or receiving in TDD fashion. The antenna switch is controlled in accordance with the reception and transmission of data. Note that the transceiver 210 is shown only as an example to illustrate the application of the oscillator of the present invention in a TDD transceiver. One skilled in the RF arts is able to apply the oscillator to a myriad of circuit applications wherever an oscillator is required that covers a wide frequency band. The range switching of the present invention functions to widen the frequency range of a VCO by providing 'coarse' tuning or range tuning.

While the invention has been described with respect to a limited number of embodiments, it will be appreciated that many variations, modifications and other applications of the invention may be made.

What is claimed is:

1. A voltage controlled oscillator (VCO) having a plurality of frequency bands, comprising:

resonator means comprising a capacitance and a tapped inductor connected at one end to ground;

a frequency range switching circuit comprising a DC blocking capacitor and a signal diode coupled in a series combination between ground and said tap point on said inductor, a range control signal coupled via a resistor to the junction between said DC blocking capacitor and said signal diode, said frequency range switching circuit operative to short said tap point to ground in response to a range control signal thereby switching the range of oscillation frequencies of said oscillator;

wherein the removal of said range control signal generates a cutoff bias across said signal diode via self rectification of RF voltage produced by said VCO;

tuning means operative to vary the frequency of oscillation of said oscillator within a frequency range in accordance with a tuning voltage input thereto;

amplifier means connected to said resonator for generating an oscillation signal as determined by said resonator; and feedback means connected to said amplifier means and adapted to ensure the oscillation of said oscillator.

2. The oscillator according to claim 1, wherein said tapped inductor comprises a lumped inductance.

3. The oscillator according to claim 1, wherein said tapped inductor comprises a printed inductance.

4. The oscillator according to claim 1, wherein said tapped inductor comprises a combination of printed and lumped inductances.

5. The oscillator according to claim 1, wherein said tapped inductor comprises an inductance constructed from microstrip line.

6. The oscillator according to claim 1, wherein said tuning means comprises a varactor diode.

7. A voltage controlled oscillator (VCO) having a plurality of frequency bands, comprising:

resonator means comprising a capacitance and an inductor connected at one end to ground, said inductor comprising a plurality of taps;

a plurality of frequency range switching circuits, each circuit corresponding to a different frequency band and comprising a DC blocking capacitor and a signal diode coupled in a series combination between ground and one of said plurality of tap points on said inductor, a range control signal coupled via a resistor to the junction between said DC blocking capacitor and said signal diode, said frequency range switching circuit operative to short its corresponding tap point to ground in response to a range control signal thereby switching the range of oscillation frequencies of said oscillator;

wherein the frequency range of said oscillator is determined by a set of range control signals applied to said plurality of frequency range switching circuits;

wherein the removal of said range control signal generates a cutoff bias across said signal diode via self rectification of RF voltage produced by said VCO;

tuning means operative to vary the frequency of oscillation of said VCO within a frequency range in accordance with a tuning voltage input thereto;

amplifier means connected to said resonator for generating an oscillation signal as determined by said resonator;

feedback means connected to said amplifier means and adapted to ensure the oscillation of said VCO.

8. The oscillator according to claim 7, wherein said tuning means comprises a varactor diode.

9. A radio frequency (RF) transceiver, comprising:

an oscillator comprising:

resonator means comprising a capacitance and an inductor connected at one end to ground, said inductor comprising one or more tap points;

one or more frequency range switching circuits, each circuit corresponding to a different frequency band and comprising a DC blocking capacitor and a signal diode coupled in a series combination between ground and one of said plurality of tap points on said inductor, a range control signal coupled via a resistor to the junction between said DC blocking capacitor and said signal diode, said frequency range switching circuit operative to short its corresponding tap point to ground in response to a range control signal thereby switching the range of oscillation frequencies of said oscillator;

wherein the frequency range of said oscillator is selected by a set of one or more range control signals, each individual range control signal applied to one of said frequency range switching circuits;

wherein the removal of said range control signal generates a cutoff bias across said signal diode via self rectification of RF voltage produced by said VCO;

tuning means operative to vary the frequency of oscillation of said oscillator within a frequency range in accordance with a tuning voltage input thereto;

amplifier means connected to said resonator means for generating an oscillation signal therefrom;

feedback means connected to said amplifier means and adapted to ensure the oscillation of said oscillator;

receiver circuitry coupled to an antenna, said receiver circuitry for receiving and demodulating an RF signal; and transmitter circuitry coupled to an antenna, said transmitter circuitry for modulating an RF carrier derived from said oscillator.

10. The oscillator according to claim 1, wherein said series combination comprises a first end of said capacitor coupled to said tap point of said inductor, a second end of said capacitor coupled to an anode of said signal diode, and a cathode of said diode coupled to ground.

11. The oscillator according to claim 1, wherein said series combination comprises a first end of said capacitor coupled to ground, a second end of said capacitor coupled to an anode of said diode, a cathode of said signal diode coupled to said tap point of said inductor.

12. The oscillator according to claim 1, wherein said frequency range switching circuit is operative to short said tap point of said inductor to ground when said range control signal comprises a positive voltage above at least the voltage drop across said signal diode.

13. The oscillator according to claim 1, wherein said frequency range switching circuit is operative to remove said short to ground when said range control signal is removed.

14. The oscillator according to claim 7, wherein said inductor comprises a lumped inductance.

15. The oscillator according to claim 7, wherein said inductor comprises a printed inductance.

16. The oscillator according to claim 7, wherein said inductor comprises a combination of printed and lumped inductances.

17. The oscillator according to claim 7, wherein said inductor comprises an inductance constructed from microstrip line.

18. The oscillator according to claim 7, wherein said series combination comprises a first end of said capacitor coupled to a corresponding tap point of said inductor, a second end of said capacitor coupled to an anode of said signal diode, and a cathode of said signal diode coupled to ground.

19. The oscillator according to claim 7, wherein said series combination comprises a first end of said capacitor coupled to ground, a second end of said capacitor coupled to an anode of said diode, a cathode of said signal diode coupled to a corresponding tap point of said inductor.

20. The oscillator according to claim 7, wherein said frequency range switching circuit is operative to short said tap point of said inductor to ground when said range control signal comprises a positive voltage above at least the voltage drop across said signal diode.

21. The oscillator according to claim 7, wherein said frequency range switching circuit is operative to remove said short to ground when said range control signal is removed.

22. The oscillator according to claim 9, wherein said inductor comprises a lumped inductance.

23. The oscillator, according to claim 9, wherein said inductor comprises a printed inductance.

24. The oscillator according to claim 9, wherein said inductor comprises a combination of printed and lumped inductances.

25. The oscillator according to claim 9, wherein said inductor comprises an inductance constructed from microstrip line.

26. The oscillator according to claim 9, wherein said tuning means comprises a varactor diode.

27. The oscillator according to claim 9, wherein said series combination comprises a first end of said capacitor coupled to a corresponding said tap point of said inductor, a second end of said capacitor coupled to an anode of said signal diode, and a cathode of said diode coupled to ground.

28. The oscillator according to claim 9, wherein said series combination comprises a first end of said capacitor coupled to ground, a second end of said capacitor coupled to an anode of said diode, a cathode of said signal diode coupled a corresponding tap point of said inductor.

29. The oscillator according to claim 9, wherein said frequency range switching circuit is operative to short its corresponding tap point to ground when said range control signal comprises a positive voltage above at least the voltage drop across said signal diode.

30. The oscillator according to claim 9, wherein said frequency range switching circuit is operative to remove said short to ground when said range control is removed.

31. The oscillator according to claim 1, wherein said frequency range switching circuit is operative to remove said short to ground when said range control signal comprises a negative voltage.

32. The oscillator according to claim 7, wherein said frequency range switching circuit is operative to remove said short to ground when said range control signal comprises a negative voltage.

33. The oscillator according to claim 9, wherein said frequency range switching circuit is operative to remove said short to ground when said range control signal comprises a negative voltage.

\* \* \* \* \*